US007754352B2

(12) United States Patent
Perkins et al.

(10) Patent No.: US 7,754,352 B2
(45) Date of Patent: Jul. 13, 2010

(54) AMORPHOUS SEMICONDUCTING AND CONDUCTING TRANSPARENT METAL OXIDE THIN FILMS AND PRODUCTION THEREOF

(75) Inventors: John Perkins, Boulder, CO (US); Marinus Franciscus Antonius Maria Van Hest, Lakewood, CO (US); David Ginley, Evergreen, CO (US); Matthew Taylor, Golden, CO (US); George A. Neuman, Holland, MI (US); Henry A. Luten, Holland, MI (US); Jeffrey A. Forgette, Hudsonville, MI (US); John S. Anderson, Holland, MI (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 379 days.

(21) Appl. No.: 11/738,344

(22) Filed: Apr. 20, 2007

(65) Prior Publication Data

US 2008/0261070 A1     Oct. 23, 2008

(51) Int. Cl.
*B32B 15/00*     (2006.01)
*C23C 16/00*     (2006.01)

(52) U.S. Cl. .................. 428/702; 428/689; 428/640; 427/250

(58) Field of Classification Search .................. None
See application file for complete search history.

(56) References Cited

U.S. PATENT DOCUMENTS

| | | | |
|---|---|---|---|
| 6,040,056 | A  | 3/2000  | Anzaki et al. |
| 6,261,694 | B1 | 7/2001  | Iacovangelo et al. |
| 6,743,488 | B2 | 6/2004  | Memarian et al. |
| 6,955,578 | B2 | 10/2005 | Park et al. |

2006/0007366 A1   1/2006   Gotoh et al.

OTHER PUBLICATIONS

T. Minami. J. Vac. Sci. Technology, Jul./Aug. 1999, A17(A), p. 1765-1772.*
T. Minami et al. Thin Solid Films, 1995, 270, p. 22-25.*
Naghavi, et al, "Systematic Study and Performance Optimization of . . . Thin Films", Electrochimica Acta 46, (2001) 2007-2013.
Minami et al, "Highly Transparent and Conductive . . . by d.c. Magnetron Sputtering", Thin Solid Films 290-291, (1996) 1-5.
Minami et al, "Highly Transparent and Conductive . . . by RF Magnetron Sputtering", Jpn. J. Appli. Phys. vol. 24, (1995) Pt. 2, No. 8A.

(Continued)

*Primary Examiner*—Jennifer C McNeil
*Assistant Examiner*—Vera Katz
(74) *Attorney, Agent, or Firm*—Paul J. White; John C. Stolpa; Mark D. Trenner

(57) ABSTRACT

Metal oxide thin films and production thereof are disclosed. An exemplary method of producing a metal oxide thin film may comprise introducing at least two metallic elements and oxygen into a process chamber to form a metal oxide. The method may also comprise depositing the metal oxide on a substrate in the process chamber. The method may also comprise simultaneously controlling a ratio of the at least two metallic elements and a stoichiometry of the oxygen during deposition. Exemplary amorphous metal oxide thin films produced according to the methods herein may exhibit highly transparent properties, highly conductive properties, and/or other opto-electronic properties.

28 Claims, 12 Drawing Sheets

OTHER PUBLICATIONS

Naghavi, et al, "Characterization of Indium Zinc oxide . . . Target", Thin Solid Films 360, (2000) 233-240.

Moriga, et al, "Effects of Introduction of Argon . . . by Pulsed Laser Deposition", Thin Solid Films 486, (2005) 53-57.

Taylor, et al, "The Electrical, Optical and Structural . . . by Combinatorial Techniques", Meas. Sci. Technol. 16, (2005) 90-94.

Minami, et al, "Preparation of Transparent . . . Magnetron Sputtering", Thin Solid Films 317, (1998) 326-329.

Joseph, et al, "Studies on Preparation . . . by Chemical Spray Deposition", Bull. Mater. Sci. vol. 28, No. 5, (Aug. 2005) 487-493.

Perkins et al, "Combinatorial Optimization of Transparent Conducting Oxides (TCOs) for PV", 31st IEEE Photovoltaics Conference, (Jan. 3-7, 2005).

Perkins et al, "Optimization of Transparent Conducting Amorphous In-Zn-0 (a-IZO) Thin Films", Session GG12, (Apr. 2006).

* cited by examiner

AMORPHOUS SEMICONDUCTING AND CONDUCTING TRANSPARENT METAL OXIDE THIN FILMS AND PRODUCTION THEREOF

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

TECHNICAL FIELD

The described subject matter relates to amorphous semiconducting and conducting transparent metal oxide thin films and production thereof.

BACKGROUND

Transparent amorphous metal oxide coatings may be applied to substrates or over-coated on top of other previously deposited layers. Such, layers may exhibit high transparency with electrical conductivity ranging from semiconducting to highly conducting, Accordingly, these coatings, or "thin films" as they are often referred, to, may be used for a wide range of opto-electronic applications. For example, thin, films may be used in the manufacture of electronic devices, such as, liquid crystal displays (LCDs), and touch panel devices (e.g., personal digital assistants (PDAs) and electronic controllers), photovoltaic solar cells and transparent thin film transistors to name only a few examples.

Known deposition techniques may be implemented during the manufacture process to deposit an amorphous metal oxide as the thin film on a substrate. Indium Zinc Oxide (also commonly referred to as IZO) is often used because it can be deposited at low temperatures, results in smooth films, can be readily etched, and exhibits thermal stability. However, other amorphous metal oxides (e.g., Zn—Sn—O, In—Ga—O, and Zn—In—Sn—O) may also be used depending on the desired properties of the thin film, cost, operational parameters, and other factors.

In order to achieve the desired opto-electronic properties of the thin film, the relative quantities of metal alloy and oxygen introduced during the deposition process are typically determined on a "trial and error" basis for a particular deposition chamber and target material stoichiometry. Once determined, it was believed that the amount of oxygen could not be varied without affecting the opto-electronic properties of the thin film. The manufacture process of these thin films has been constrained by fixed processing parameters.

The reported optimum Zn/(Zn+In) content in the target/ coating necessary to get the optimum properties varies dramatically within the reported literature. In Naghavi, et al, (Electrochimica Acta 46 (2001) 2007-2013) the authors report with Pulsed Laser Deposition (PLD) that a 50% Zn content gives the best properties. Their test was at a fixed oxygen content in the PLD atmosphere and a substrate temperature of 500° C. In Minami et al, (Thin Solid Films 290-291 (1996) 1-5) the authors show that the optimum Zn content in the coatings varies with the substrate temperature. At room temperature substrate the preferred Zn content is 24.5% while at a substrate temperature of 350° C. the preferred composition is 42.2% Zn, The Minami tests were conducted at a fixed oxygen composition in the sputter environment. The researchers examined pressure effects only at the preferred compositions at each temperature, in Minami, et al (Jpn. J. Appl. Phys. Vol. 24 (1995) Pt. 2, No. 8A) the composition of Zn in IZO is evaluated in a chamber absent of oxygen and at a fixed pressure. The composition is varied to determine the optimum conductivity then other process conditions are varied such as oxygen flow, total pressure and substrate temperature. They found that additional oxygen was detrimental at their optimum composition of 30% Zn. The Minami research also resulted in coatings with extremely high refractive indices which can be detrimental in some optical applications. In Naghavi et al, (Thin Solid Films 360 (2000) 233-240) the researchers add hydrogen to the list of process variables in a PLD process and report that the optimum Zn content is at 60%. The effect of any given process variable is not readily apparent from this study because changes in one process variable often affects multiple aspects of the coating composition and there are therefore insufficient independent variables to properly determine the trends with process conditions. In Moriga, et al, (Thin Solid Films 486 (2005) 53-57) the researchers use PLD to study IZO. They examined the properties of the coatings at two oxygen levels and one argon/ oxygen mixture. The slope of resistivity with composition varies with which gas is in the chamber but the chamber gas also affects the composition of the coating. The researchers do not report the effects in terms of the coating composition but rather in terms of the target composition. Since the coating does not match the target equivalently with the different chamber gasses it is impossible to uniquely identify the effects of the different process variables. The optimum resistance values occur at 40% Zn content in the target irrespective of the sputtering gas. Finally, in Taylor, et al (Meas. Set, Technol. 16 (2005) 90-94) the researchers show the optimum composition at 30% Zn content. Their study did not look at the effects of the process just the composition of the coating.

All of these studies point to different Zn contents and the wide range of process conditions do not lead one to determine how to optimize the IZO coating at a given composition. There is almost a "trial-and-error" or "empirical nature" to these approaches which has limited the useful compositions of IZO.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope, in various embodiments, one or more of the above-described problems have been reduced or eliminated, while other embodiments are directed to other improvements.

An exemplary method of producing an amorphous mixed metal oxide thin film may comprise: introducing at least two metallic elements and oxygen into a process chamber to form a metal oxide, depositing the metal oxide on a substrate in the process chamber, and simultaneously controlling a ratio of the at least two metallic elements and a stoichiometry of the oxygen during deposition.

Another exemplary method of optimizing at least one property of a metal oxide thin film may comprise: determining a continuum of oxygen partial pressure for corresponding metal ratios of a resulting metal oxide thin film, simultaneously controlling the metal ratios and the oxygen partial pressure during a deposition process based on the continuum, and depositing the metal oxide thin film on a substrate.

Exemplary metal oxide thin films produced according to the methods described herein may exhibit desirable properties such as high electrical conductivity, high transparency, and/or other opto-electronic properties or physical properties such as, but not limited to high electron mobility, robustness to thermal processing, and low surface roughness. The metal oxide thin films may also be amorphous.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Briefly, a sputter deposition process to make metal oxide thin films may be implemented using either a metallic target in an oxygen atmosphere or a ceramic metal oxide target in an atmosphere which may or may not contain, oxygen. Electrical and/or optical properties of the metal oxide thin film may be controlled by varying the ratio of metals and/or the oxygen (e.g., wt %, stoichiometry, partial pressure, etc.) during the sputter deposition process. Accordingly, the metal oxide thin films produced according to the methods disclosed herein have application in a wide variety of opto-electronic devices. Exemplary metal oxide thin films and methods of production thereof may be better understood with reference to the Figures and following discussion.

Figure 1:
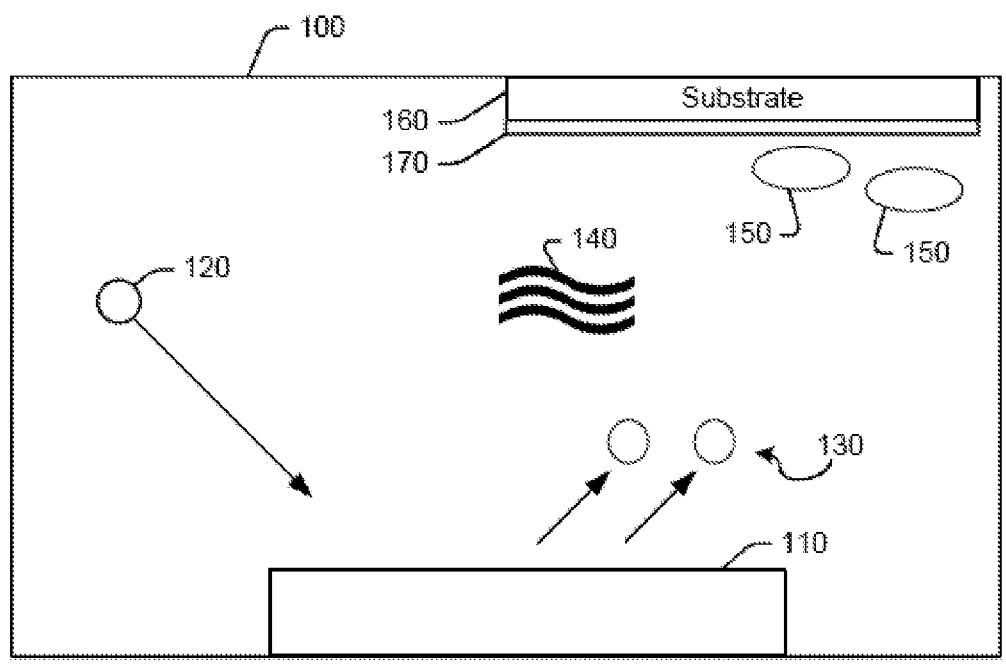
FIG. 1 is a high-level schematic illustration of an exemplary sputtering process for producing a metal oxide thin film.

FIG. 1 is a high-level schematic illustration of an exemplary sputtering process for producing a metal oxide thin film. Sputtering is a physical vapor deposition (PVD) process well known for depositing metal oxide layers (or thin films) on a substrate.

In an exemplary embodiment, the deposition process may be implemented as radio-frequency (RF) magnetron sputtering. A process chamber 100 is provided with a ceramic metal oxide alloy referred to as the target 110. The target 110 may include at least two metals (e.g., Cu, In, Zn, Ga, Cd, Sn, Al, Ti, and Sb, etc., including others that will be apparent to those skilled in the art). For purposes of illustration, the target 110 in FIG. 1 includes in and Zn. Alternatively, separate and/or multiple targets may be provided for each metal oxide.

It is noted that metal and/or metal alloy targets may be used in place of metal oxide targets. It is also noted that direct current (DC) or alternating current (AC) sputtering may also be used instead of RF sputtering.

During the deposition process, the target 110 may be bombarded by ions 120 (e.g., Neon, Argon 40, Kr, and Xe, or mixtures thereof), which causes constituent atoms 130 (e.g. In, Zn, and oxygen ions) to be dislodged and emitted from the surface of the target 110. It is noted that a reactive component (e.g. 2%, 4%, or 6% molecular oxygen, $N_2O$ or other gases) may be mixed into the inert gas (e.g., the Neon, Argon, Kr, and Xe), if desired. The metal atoms 130 may be subjected to a reactive atmosphere 140 (e.g., oxygen and/or hydrogen) prior to deposition to form metal oxides 150.

The metal oxides 150 deposit on a substrate material 160 as a metal oxide thin film 170. In exemplary embodiments, the substrate material 160 may be an electrically conducting and/or transparent material, e.g., a tin oxide-coated glass, copper, aluminum or other material. However, the substrate material 160 is not limited to any particular type of material. The substrate material 160 will depend at least to some extent on the application, as will be understood by those having ordinary skill in the art after becoming familiar with the teachings herein. The metal oxide coating may also be over-coated on previously deposited and processed layers on the substrate, such as, e.g., when making a top contact to a opto-electronic device with a layered structure.

It is noted that the deposition process may also include additional operations. In an exemplary embodiment, the substrate material 160 having the deposited metal oxide thin film 170 may be thermally annealed. Other operations may also include varying operating parameters, e.g., temperature, relative concentrations of the metal ions, etc. Still other operations may also be implemented, as may be required to produce composite materials with the desired (i.e., predetermined) physical and electronic properties.

Before continuing, it is also noted that the deposition process described above with reference to FIG. 1 is provided for purposes of illustration and is not intended to be limiting. Other types of deposition processes, e.g., chemical vapor deposition, physical vapor deposition or others, now known or later developed, are also contemplated as being suitable for the described purposes.

The oxygen content and/or various properties of the metal oxide thin film, are dependant on many process parameters. These include, but are not limited to, the oxygen content of the target 110, configuration of the process chamber (including the oxygen distribution and pumping systems), the oxygen content of the process gas 140 and the pressure achieved during the deposition process, to name only a few examples.

In the past in order to achieve the desired properties of the product, the metals composition used for the deposition process were believed to be fixed and the particular oxygen feed optimized during the deposition process in order to achieve the desired properties of the metal oxide thin film. It is observed, however, that the oxygen level is dependent on, or is a function of, the ratio of metals used for the deposition process.

Figure 2A:
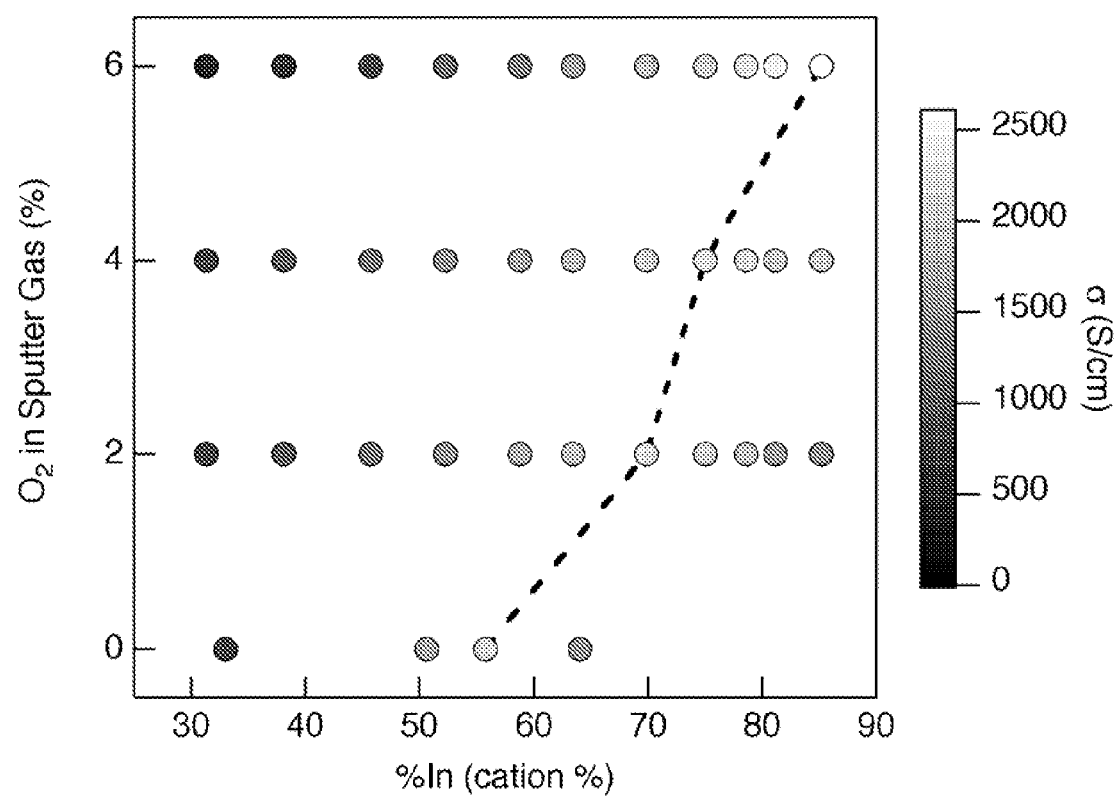
FIG. 2a-c are exemplary plots illustrating the coupled effect of oxygen stoichiometry and percent metal on conductivity of an exemplary IZO thin film deposited at substrate temperatures (a) $T_S=100°$ C., (b) $T_S=200°$ C., and (c) $T_S-300°$ C.
Figure 2B:
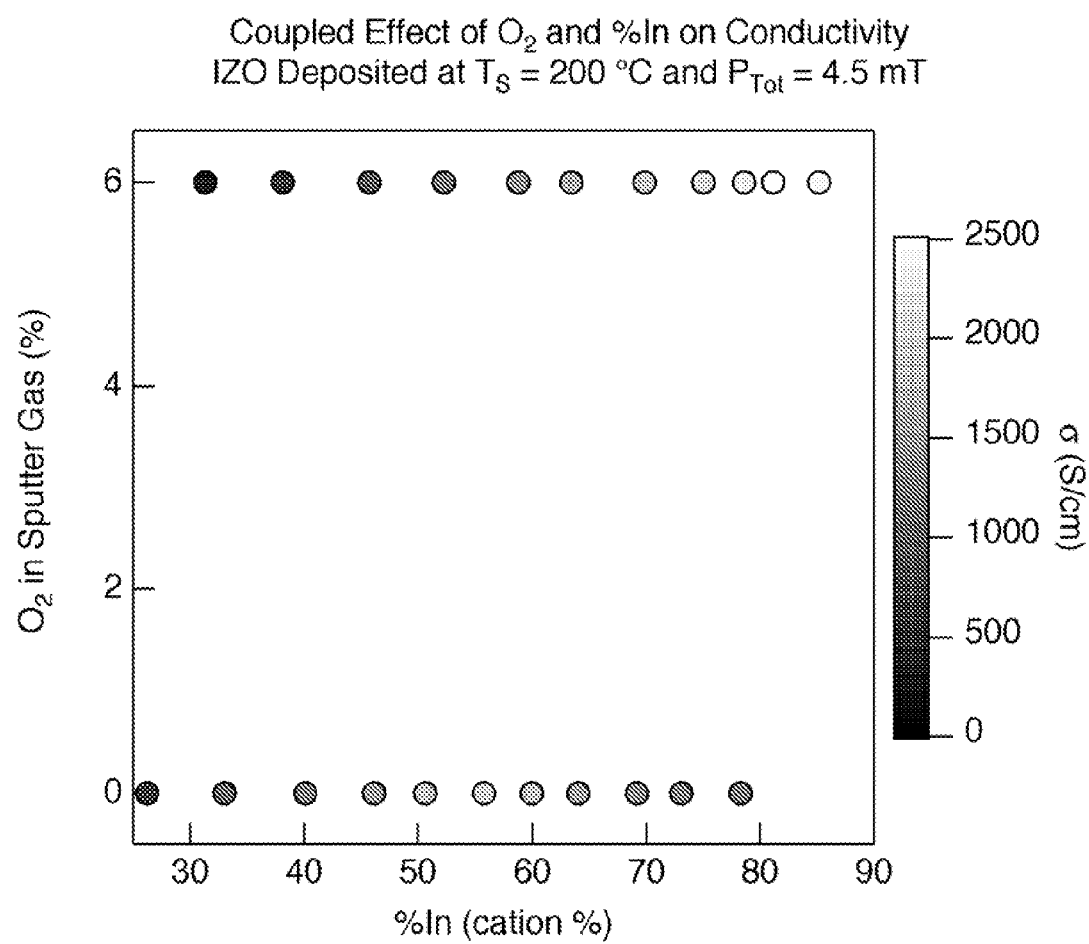
Figure 2C:
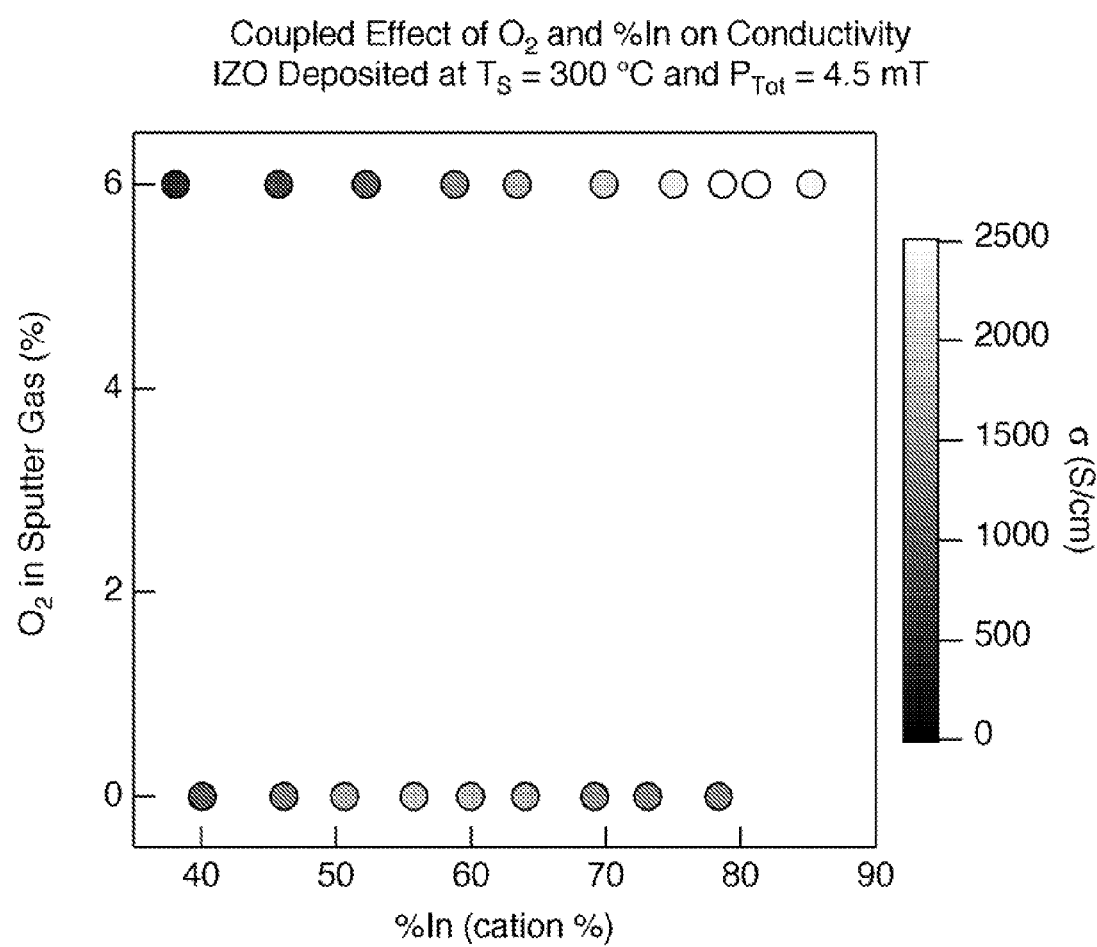

This can be observed qualitatively by the exemplary data plotted in FIGS. 2a-c. FIG. 2a is an exemplary plot illustrating the coupled effect of oxygen stoichiometry and percent metal on conductivity of an exemplary IZO thin film deposited at substrate temperature $T_S=100°$ C. It is observed that the ridge of maximum conductivity is angled, indicating that the best choices of oxygen content and metals composition are coupled. That is, as the Zn fraction of an In—Zn target 110 increases, less oxygen (e.g., a lower oxygen partial pressure) is needed to achieve similar properties in the metal oxide thin film. Alternatively, as the In fraction of the In—Zn target 110 increases, more oxygen (e.g., a higher oxygen partial pressure) is needed to achieve the same properties in the metal oxide thin film. Accordingly, the metals content and/or the oxygen used during the deposition process are not fixed, but rather can be varied in a coupled fashion to achieve the desired properties of the metal oxide thin film. It is noted that the observed ridge of maximum conductivity may be extended or continued to higher Zn contents by the addition of an active reducing agent, such as hydrogen, in the sputter gas (i.e., beyond that which is achieved at 0% oxygen).

FIG. 2b shows corresponding data for IZO films grown at substrate temperature $T_S=200°$ C. and FIG. 2c shows the data for IZO films grown at $T_S=300°$ C. For the IZO films grown at both 200° C. and 300° C., the maximum conductivity occurs at higher % In for the films grown in 6% $O_2$ sputter gas than those grown in pure Argon (0% $O_2$). This is the same result as shown in more detail in FIG. 2a. Therefore, it is noted that this effect occurs is not limited to just films grown at 100° C., but occurs for a range of substrate temperatures within which amorphous IZO films can be grown. In particular, it is expected that this effect will also occur for films grown at ambient temperature.

Table 1 shows data used to generates the plots shown in FIGS. 2a-c in a tabular form. Table 1.1 shows whether the samples on which Table 1 are based were amorphous (A) or crystalline (X) as deposited.

TABLE 1

| Data Point | % $O_2$ in Ar sputter gas | % In (cation %) | Conductivity (S/cm) @ $T_S$ = 100 C. | Conductivity (S/cm) @ $T_S$ = 200 C. | Conductivity (S/cm) @ $T_S$ = 300 C. |
|---|---|---|---|---|---|
| 1 | 0.0 | 26.2 | | 716.5 | 523.403 |
| 2 | 0.0 | 33.0 | 853.9 | 1101.4 | 764.286 |
| 3 | 0.0 | 40.1 | | 1342.8 | 1040.24 |
| 4 | 0.0 | 46.1 | | 1567.9 | 1373.44 |
| 5 | 0.0 | 50.7 | 1741.9 | 1842.6 | 1719.02 |
| 6 | 0.0 | 55.8 | 2082.6 | 1961.0 | 1915.95 |
| 7 | 0.0 | 60.0 | | 1825.5 | 1900.69 |
| 8 | 0.0 | 64.0 | 1569.5 | 1560.1 | 1730.29 |
| 9 | 0.0 | 69.2 | | 1405.1 | 1486.3 |
| 10 | 0.0 | 73.1 | | 1340.1 | 1386.49 |
| 11 | 0.0 | 76.3 | | 1296.5 | 1409.54 |
| 12 | 2.0 | 31.3 | 778.0 | | |
| 13 | 2.0 | 38.1 | 1049.5 | | |
| 14 | 2.0 | 45.7 | 1303.8 | | |
| 15 | 2.0 | 52.3 | 1495.6 | | |
| 16 | 2.0 | 58.8 | 1761.9 | | |
| 17 | 2.0 | 63.4 | 1972.9 | | |
| 18 | 2.0 | 69.9 | 2209.1 | | |
| 19 | 2.0 | 75.0 | 2104.1 | | |
| 20 | 2.0 | 78.6 | 1921.0 | | |
| 21 | 2.0 | 81.2 | 1582.4 | | |
| 22 | 2.0 | 85.2 | 1486.9 | | |
| 23 | 4.0 | 31.3 | 833.3 | | |
| 24 | 4.0 | 38.1 | 1081.4 | | |
| 25 | 4.0 | 45.7 | 1328.0 | | |
| 26 | 4.0 | 52.3 | 1494.3 | | |
| 27 | 4.0 | 58.8 | 1709.9 | | |
| 28 | 4.0 | 63.4 | 1918.0 | | |
| 29 | 4.0 | 69.9 | 2068.1 | | |
| 30 | 4.0 | 75.0 | 2263.0 | | |
| 31 | 4.0 | 78.6 | 2195.3 | | |
| 32 | 4.0 | 81.2 | 2018.1 | | |
| 33 | 4.0 | 85.2 | 2075.9 | | |
| 34 | 6.0 | 31.3 | 504.3 | 320.1 | 322.001 |
| 35 | 6.0 | 38.1 | 690.9 | 601.5 | 511.998 |
| 36 | 6.0 | 45.7 | 934.3 | 903.0 | 803.374 |
| 37 | 6.0 | 52.3 | 1162.6 | 1200.0 | 1116.27 |
| 38 | 6.0 | 58.8 | 1385.3 | 1480.9 | 1439.09 |
| 39 | 6.0 | 63.4 | 1649.6 | 1720.8 | 1755.62 |
| 40 | 6.0 | 69.9 | 1815.6 | 1922.8 | 2043.38 |
| 41 | 6.0 | 75.0 | 2041.5 | 2118.6 | 2322.25 |
| 42 | 6.0 | 78.6 | 2250.4 | 2273.6 | 2529.14 |
| 43 | 6.0 | 81.2 | 2412.2 | 2444.0 | 2652.37 |
| 44 | 6.0 | 85.2 | 2523.5 | 2422.9 | 2377.26 |

TABLE 1.1

Crystallinity from X-Ray Diffraction

| Point | % $O_2$ in Ar sputter gas | % In (cation %) | @ $T_S$ = 100 C. | @ $T_S$ = 200 C. | @ $T_S$ = 300 C. |
|---|---|---|---|---|---|
| 1 | 0.0 | 26.2 | X | X | X |
| 2 | 0.0 | 33.0 | X | A | X |
| 3 | 0.0 | 40.1 | A | A | X |
| 4 | 0.0 | 46.1 | A | A | A |
| 5 | 0.0 | 50.7 | A | A | A |
| 6 | 0.0 | 55.8 | A | A | A |
| 7 | 0.0 | 60.0 | A | A | A |
| 8 | 0.0 | 64.0 | A | A | A |
| 9 | 0.0 | 69.2 | A | A | A |
| 10 | 0.0 | 73.1 | A | A | A |
| 11 | 0.0 | 78.3 | A | A | A |
| 12 | 2.0 | 31.3 | A | | |
| 13 | 2.0 | 38.1 | A | | |
| 14 | 2.0 | 45.7 | A | | |
| 15 | 2.0 | 52.3 | A | | |
| 16 | 2.0 | 58.8 | A | | |
| 17 | 2.0 | 63.4 | A | | |
| 18 | 2.0 | 69.9 | A | | |
| 19 | 2.0 | 75.0 | A | | |
| 20 | 2.0 | 78.6 | A | | |
| 21 | 2.0 | 81.2 | A | | |
| 22 | 2.0 | 85.2 | A | | |
| 23 | 4.0 | 31.3 | A | | |
| 24 | 4.0 | 38.1 | A | | |
| 25 | 4.0 | 45.7 | A | | |
| 26 | 4.0 | 52.3 | A | | |
| 27 | 4.0 | 58.8 | A | | |
| 28 | 4.0 | 63.4 | A | | |
| 29 | 4.0 | 69.9 | A | | |
| 30 | 4.0 | 75.0 | A | | |
| 31 | 4.0 | 78.6 | A | | |
| 32 | 4.0 | 81.2 | A | | |
| 33 | 4.0 | 85.2 | A | | |
| 34 | 6.0 | 31.3 | A | X | X |
| 35 | 6.0 | 38.1 | A | A | X |
| 36 | 6.0 | 45.7 | A | A | X |
| 37 | 6.0 | 52.3 | A | A | X |
| 38 | 6.0 | 58.8 | A | A | A |
| 39 | 6.0 | 63.4 | A | A | A |
| 40 | 6.0 | 69.9 | A | A | A |
| 41 | 6.0 | 75.0 | A | A | A |

TABLE 1.1-continued

Crystallinity from X-Ray Diffraction

| Point | % $O_2$ in Ar sputter gas | % In (cation %) | @ $T_S$ = 100 C. | @ $T_S$ = 200 C. | @ $T_S$ = 300 C. |
|---|---|---|---|---|---|
| 42 | 6.0 | 78.6 | A | A | A |
| 43 | 6.0 | 81.2 | A | A | A |
| 44 | 6.0 | 85.2 | A | A | X |

X = Crystalline as deposited.
A = Amorphous as deposited.
Blank = No deposition.

It is readily appreciated that applications of this technology may include, but are not limited to, liquid crystal displays (LCDs), touch, panel devices (e.g., personal digital assistants or PDAs), photovoltaic solar cells, transparent thin film transistors and other opto-electronic devices and applications.

EXAMPLE

Figure 3:
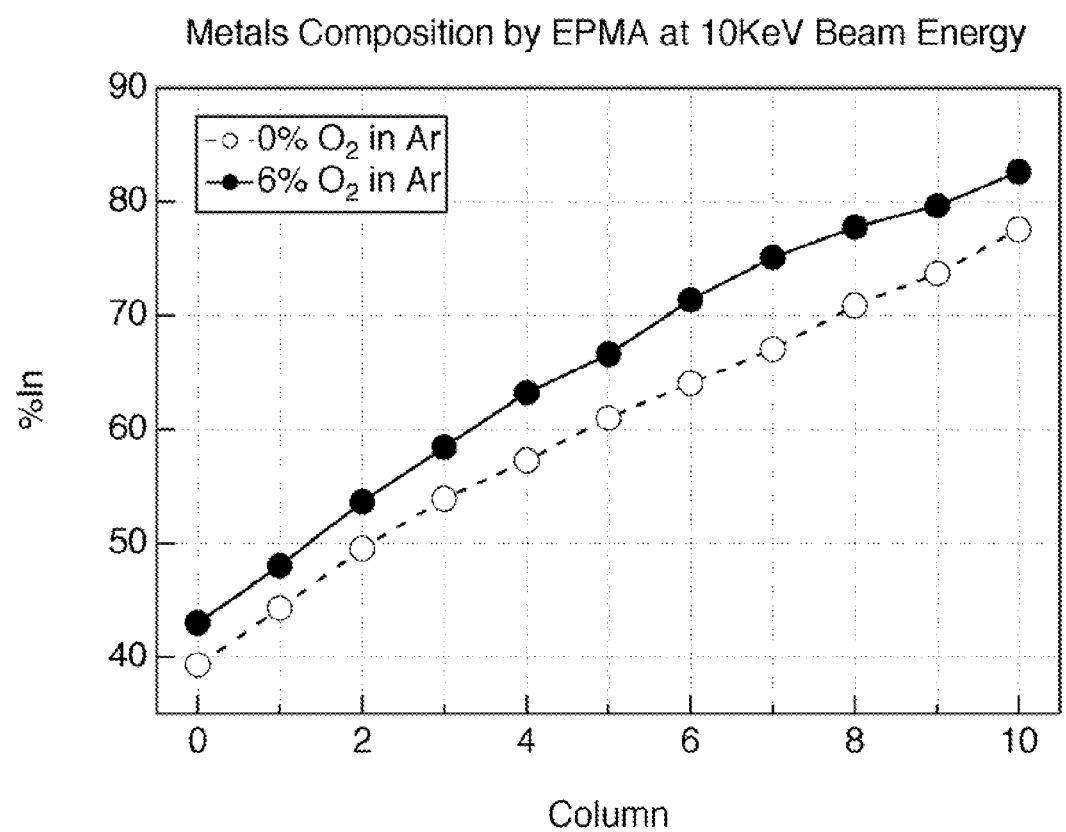
FIG. 3 shows metal composition at various positions in the exemplary IZO thin film used for FIG. 2a, the data being collected by electronic probe microanalysis (EPMA).

In this example, amorphous IZO metal oxide thin films were prepared by controlling the stoichiometry of metals and/or oxygen, content of the sputtering gas. The samples were prepared using DC sputtering in a combinatorial deposition reactor. Two 2" cathodes were arranged at a substrate with each at an angle of approximately 45 degrees and in the same plane of incidence to the substrate. The two cathodes were equipped with ZnO and InOx ceramic target materials. The power was adjusted so that the composition of the coating near the ZnO containing cathode was approximately 60% and the InOx containing cathode was adjusted so that the Zn content at the side of the substrate nearest the InOx containing cathode was approximately 20%. The details of the composition gradient are shown in FIG. 3. A thickness gradient was also present across the substrate. The percentage of oxygen was varied for the different experiments. Additionally the pressure in the chamber and the temperature of the substrate were also varied. The preferred oxygen level for optimal electrical and optical properties varied slightly with the temperature and pressure in the chamber.

It was determined that the optimum process gas mixture is a function of the metals composition of the resulting thin film. Accordingly, the stoichiometry of metals and/or oxygen content can be controlled during deposition processes to optimize properties of the metal oxide thin film. The results indicate that a particular deposition process is not limited to specific amounts of oxygen and/or metal, but rather, can be used with various amounts of oxygen and/or metals. This is particularly desirable, e.g., where the deposition process has to be conducted without oxygen, or with a fixed amount of oxygen.

FIGS. 2a-c are exemplary plots illustrating the coupled effect of oxygen stoichiometry and percent metal on conductivity of the exemplary IZO thin films deposited at several different substrate temperatures. These plots show that for a given metals composition used during the deposition process, different amounts of oxygen may be used to achieve the desired properties of the IZO thin film. That is, optimum conductivity at different In/Zn ratios can be achieved at different oxygen flow rates.

Figure 4:
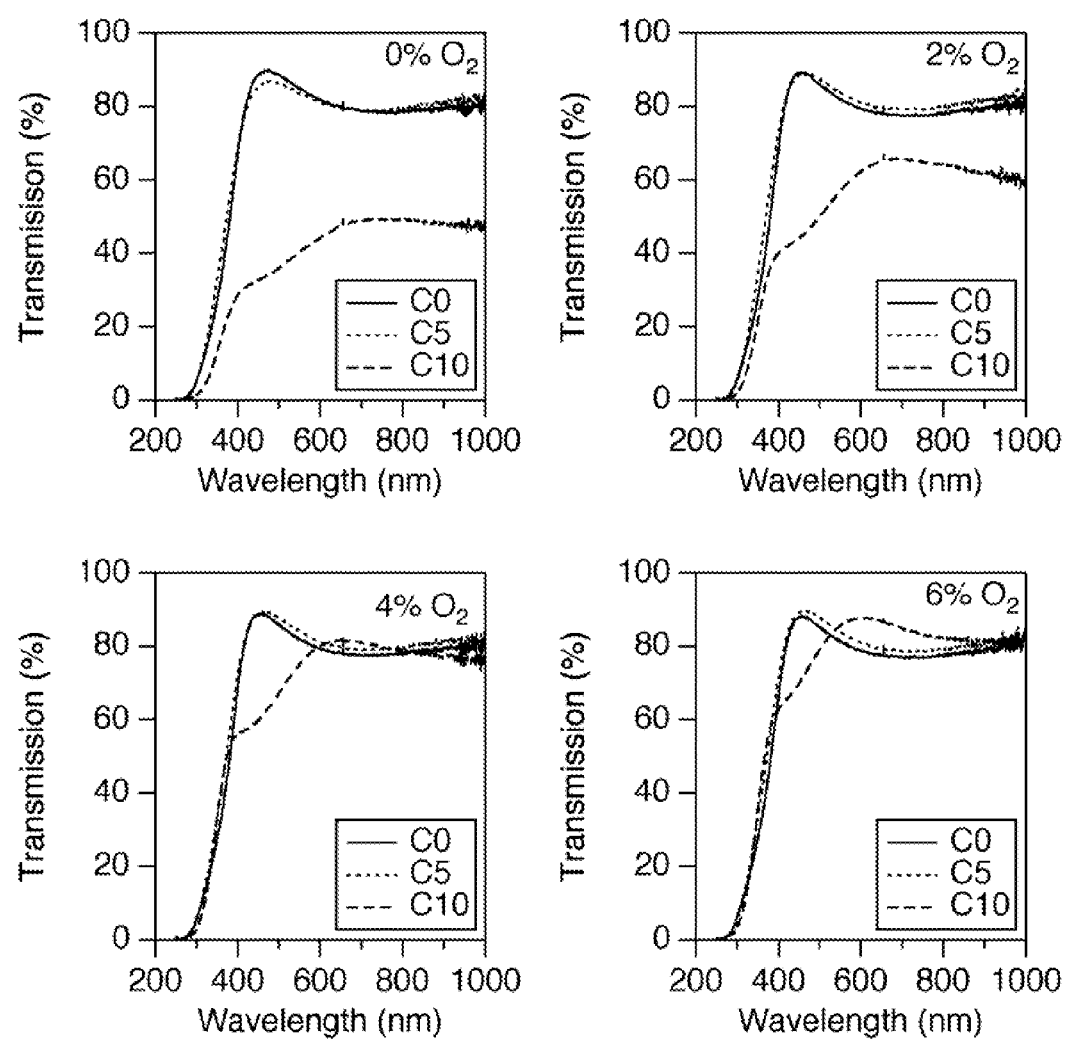
FIG. 4 are exemplary plots illustrating the coupled effect of oxygen stoichiometry on optical transmission of the exemplary IZO thin film used for FIG. 3.

FIG. 3 shows metal composition at various positions in the exemplary IZO thin film used for FIG. 2, with the data collected by electronic probe microanalysis (EPMA). EPMA employs an electron microscope specifically designed for non-destructive X-ray imaging of solid materials. EPMA is capable of high spatial resolution (about 1 um), high analytical sensitivity (less than about 0.5% for major elements), and high detection limits (about 100 .mu.m for trace elements). This plot shows the effect of oxygen on the resultant In—Zn composition ally graded samples. The shift in composition with the addition of oxygen is believed to be due to changes in the relative sputter rate of the InOx and ZnOx targets with the addition of oxygen to the sputter chamber. FIG. 4 are exemplary plots illustrating the coupled effect of oxygen stoichiometry on optical transmission of the exemplary IZO thin film used for FIG. 3. The samples included about 40, 60, and 80 wt % In and were produced using Jour different oxygen flows. This data shows that the optimal transparency also depends upon oxygen and In content of the sample in a coupled fashion. The thickness of these films is approximately 120 nm.

Figure 5:
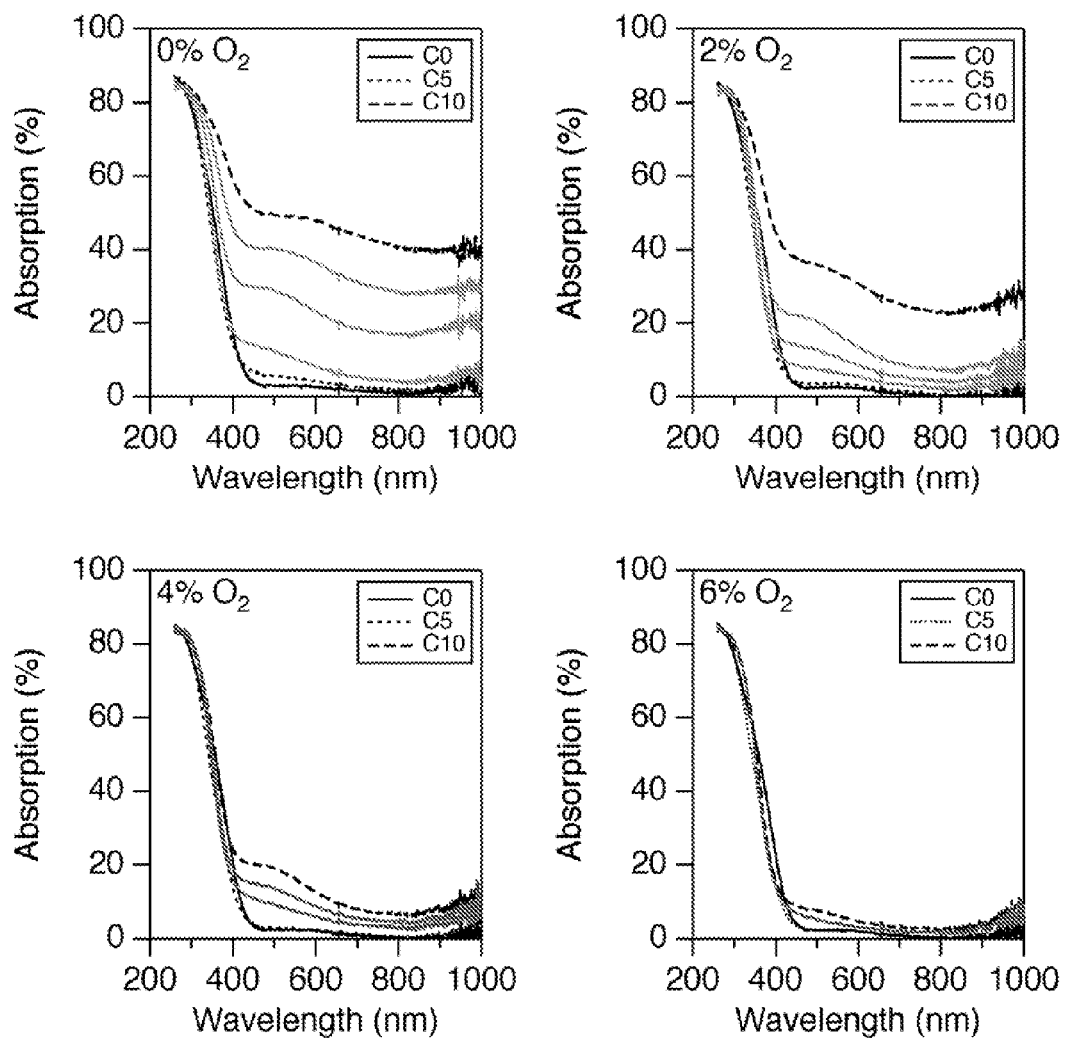
FIG. 5 are exemplary plots showing wavelength dependence of the optical absorption for the same samples for which the optical transmission, data is shown in FIG. 4.
Figure 6A:
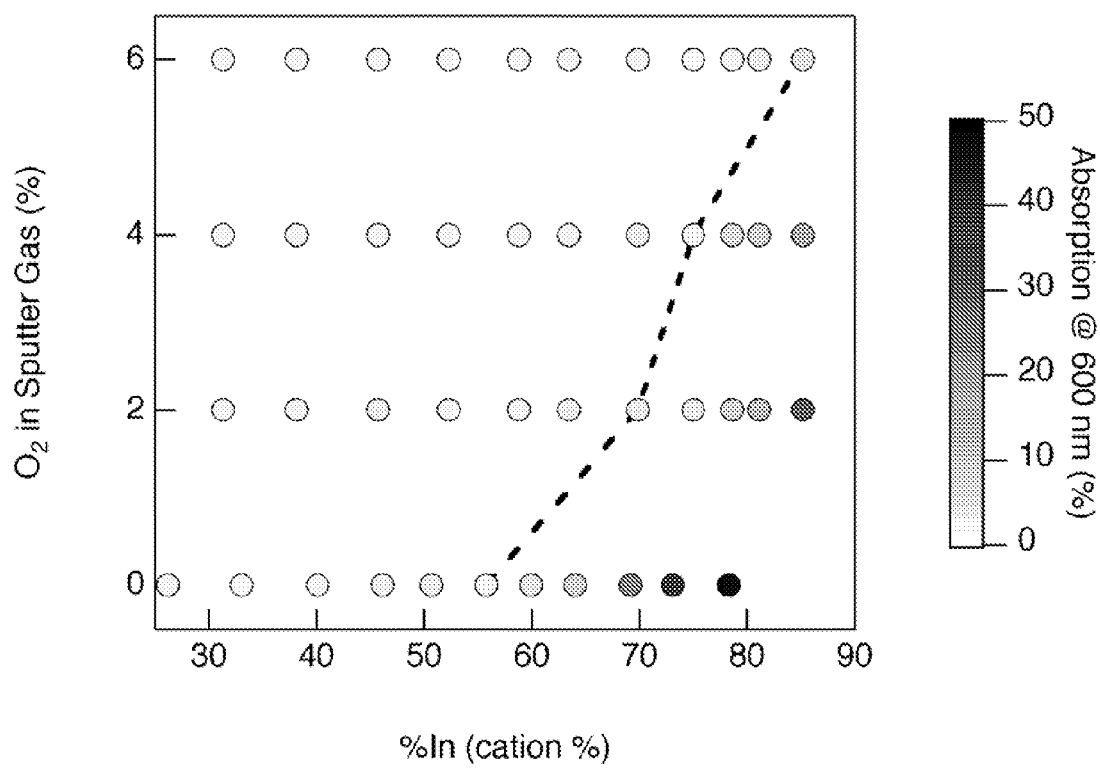
FIG. 6a-c use gray-scale intensity maps to show the dependence of the optical absorption as a function of oxygen in the sputter gas and percent In for (a) 600 nm wavelength light, (b) 500 nm wavelength light, and (c) 700 nm wavelength light.
Figure 6B:
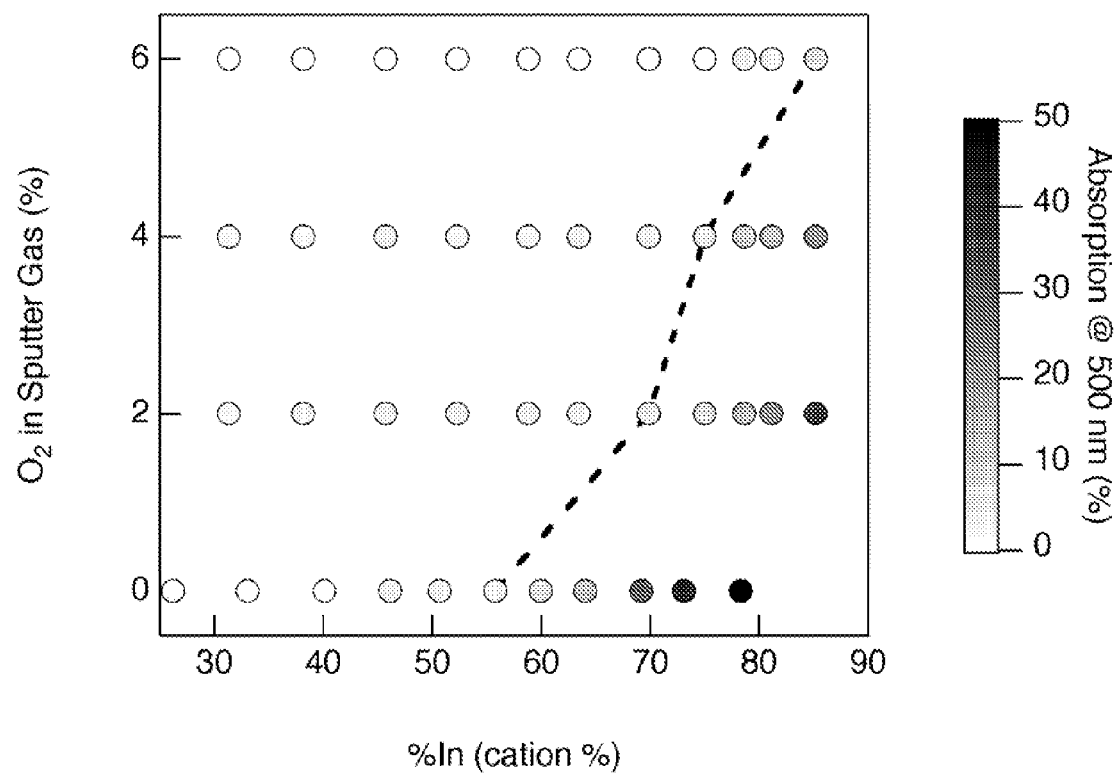
Figure 6C:
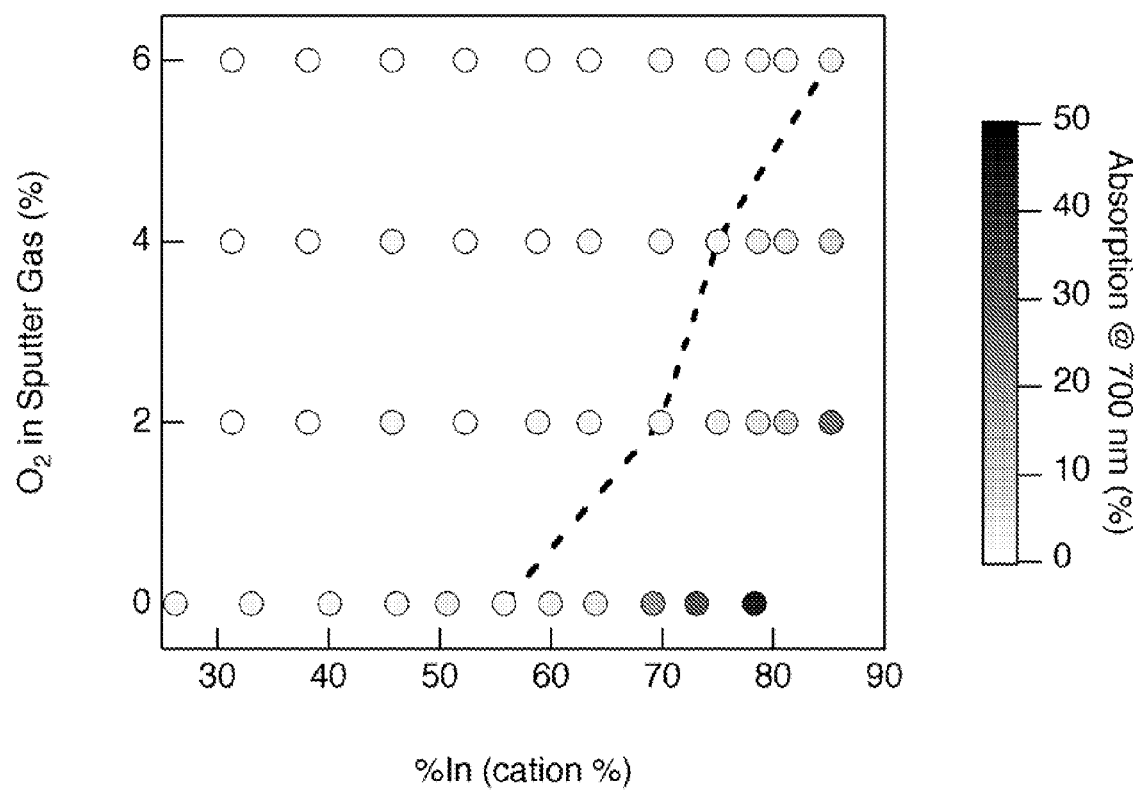

FIG. 5 are exemplary plots showing wavelength dependence of the optical absorption for the same samples for which the optical transmission data is shown in FIG. 4. It is noted that for sample spots corresponding to points to the right of the line in FIG. 2 there is substantial absorption at wavelengths longer than 400 nm. The gray lines in FIG. 5 show representative In and Zn compositions between compositions corresponding to C5 and C10. FIGS. 6a-c use gray-scale intensity maps to show the dependence of the optical absorption at different wavelengths of light as a function of oxygen in the sputter gas (along the vertical axis) and % In (along the horizontal axis), in FIG. 6a, a wavelength of 600 nm (approximately red light) is used. There is a substantial increase in the absorption for points to the right of the dashed line which is the ridge of maximum conductivity from FIG. 2. This shows that the optimization of the electrical conductivity and the optical properties are coupled. It also makes clear that the process boundary for optimizing the conductivity and that for optimizing the transparency are related and more or less the same.

FIGS. 6b and 6c use gray-scale intensity maps to show the dependence of the absorption at (b) 500 nm (blue-green) and (c) 700 nm as a function of oxygen in the sputter gas and % In in a similar fashion to FIG. 6a. This shows that the optical absorption effect demonstrated in FIGS. 6a-c occurs over a broad portion of the visible spectrum.

Table 2 shows data used to generate the plots shown in FIGS. 6a-c in tabular form. The plots C0, C5, and C10 for the 0% oxygen in FIGS. 4 and 5 correspond to data points 1, 6, and 11 in Table 2, and the plots C0, C5, and C10 for the 2% oxygen in FIGS. 4 and 5 correspond to data points 12, 17, and 22, and so forth for the 4% and 6% plots. Table 2.1 shows the corresponding absorption coefficient as calculated from the absorption data in Table 2.

TABLE 2

| | | | Absorption | | |
|---|---|---|---|---|---|
| Data Point | % $O_2$ in Ar sputter gas | % In (cation %) | Absorption (%) @ 500 nm | Absorption (%) @ 600 nm | Absorption (%) @ 700 nm |
| 1 | 0.0 | 26.2 | 3.0 | 2.7 | 1.7 |
| 2 | 0.0 | 33.0 | 3.2 | 2.7 | 1.7 |
| 3 | 0.0 | 40.1 | 2.9 | 2.7 | 1.6 |
| 4 | 0.0 | 46.1 | 3.4 | 2.9 | 1.7 |
| 5 | 0.0 | 50.7 | 5.2 | 4.3 | 2.9 |
| 6 | 0.0 | 55.8 | 5.7 | 4.2 | 2.8 |
| 7 | 0.0 | 60.0 | 8.2 | 5.7 | 3.9 |
| 8 | 0.0 | 64.0 | 12.6 | 8.2 | 5.3 |
| 9 | 0.0 | 69.2 | 29.0 | 23.1 | 18.6 |
| 10 | 0.0 | 73.1 | 40.3 | 36.4 | 31.2 |
| 11 | 0.0 | 78.3 | 49.5 | 48.0 | 44.0 |

TABLE 2-continued

Absorption

| Data Point | % O$_2$ in Ar sputter gas | % In (cation %) | Absorption (%) @ 500 nm | Absorption (%) @ 600 nm | Absorption (%) @ 700 nm |
|---|---|---|---|---|---|
| 12 | 2.0 | 31.3 | 2.6 | 2.3 | 1.1 |
| 13 | 2.0 | 38.1 | 2.8 | 2.5 | 1.1 |
| 14 | 2.0 | 45.7 | 3.2 | 2.9 | 1.5 |
| 15 | 2.0 | 52.3 | 2.9 | 2.6 | 1.2 |
| 16 | 2.0 | 58.8 | 3.2 | 2.7 | 1.5 |
| 17 | 2.0 | 63.4 | 3.6 | 3.0 | 1.6 |
| 18 | 2.0 | 69.9 | 4.8 | 4.0 | 2.2 |
| 19 | 2.0 | 75.0 | 7.4 | 5.4 | 3.4 |
| 20 | 2.0 | 78.6 | 12.8 | 8.5 | 5.6 |
| 21 | 2.0 | 81.2 | 20.3 | 13.6 | 9.0 |
| 22 | 2.0 | 85.2 | 35.8 | 30.7 | 25.3 |
| 23 | 4.0 | 31.3 | 2.5 | 2.2 | 1.1 |
| 24 | 4.0 | 38.1 | 2.3 | 2.1 | 1.1 |
| 25 | 4.0 | 45.7 | 3.1 | 2.8 | 1.7 |
| 26 | 4.0 | 52.3 | 2.5 | 2.3 | 1.2 |
| 27 | 4.0 | 58.8 | 2.7 | 2.4 | 1.2 |
| 28 | 4.0 | 63.4 | 3.0 | 2.6 | 1.4 |
| 29 | 4.0 | 69.9 | 3.8 | 3.0 | 1.9 |
| 30 | 4.0 | 75.0 | 5.5 | 3.8 | 2.7 |
| 31 | 4.0 | 78.6 | 9.2 | 5.9 | 3.9 |
| 32 | 4.0 | 81.2 | 13.7 | 8.7 | 5.8 |
| 33 | 4.0 | 85.2 | 19.1 | 12.6 | 8.0 |
| 34 | 6.0 | 31.3 | 2.3 | 2.1 | 0.9 |
| 35 | 6.0 | 38.1 | 2.2 | 2.1 | 1.0 |
| 36 | 6.0 | 45.7 | 2.2 | 2.2 | 0.9 |
| 37 | 6.0 | 52.3 | 2.2 | 2.0 | 1.0 |
| 38 | 6.0 | 58.8 | 2.2 | 2.1 | 1.2 |
| 39 | 6.0 | 63.4 | 2.1 | 2.2 | 1.2 |
| 40 | 6.0 | 69.9 | 2.3 | 2.2 | 1.5 |
| 41 | 6.0 | 75.0 | 2.6 | 2.2 | 1.6 |
| 42 | 6.0 | 78.6 | 3.5 | 2.5 | 1.8 |
| 43 | 6.0 | 81.2 | 5.0 | 3.2 | 2.4 |
| 44 | 6.0 | 85.2 | 7.6 | 4.8 | 3.2 |

TABLE 2.1

Absorption Coefficient

| | | Absorption Coefficient from Table 2 as $\alpha = \left(\frac{-1}{d}\right)\ln\left(1 - \frac{A[\%]}{100}\right)$ | | |
|---|---|---|---|---|
| Point | Ar sputter gas | % In (cation %) | $\alpha$ [10$^4$ cm$^{-1}$] @ 500 nm | $\alpha$ [10$^4$ cm$^{-1}$] @ 600 nm | $\alpha$ [10$^4$ cm$^{-1}$] @ 700 nm |
| 1 | 0.0 | 26.2 | 0.3 | 0.2 | 0.1 |
| 2 | 0.0 | 33.0 | 0.3 | 0.2 | 0.1 |
| 3 | 0.0 | 40.1 | 0.2 | 0.2 | 0.1 |
| 4 | 0.0 | 46.1 | 0.3 | 0.2 | 0.1 |
| 5 | 0.0 | 50.7 | 0.4 | 0.4 | 0.2 |
| 6 | 0.0 | 55.8 | 0.5 | 0.4 | 0.2 |
| 7 | 0.0 | 60.0 | 0.7 | 0.5 | 0.3 |
| 8 | 0.0 | 64.0 | 1.1 | 0.7 | 0.5 |
| 9 | 0.0 | 69.2 | 2.9 | 2.2 | 1.7 |
| 10 | 0.0 | 73.1 | 4.3 | 3.8 | 3.1 |
| 11 | 0.0 | 78.3 | 5.7 | 5.4 | 4.8 |
| 12 | 2.0 | 31.3 | 0.2 | 0.2 | 0.1 |
| 13 | 2.0 | 38.1 | 0.2 | 0.2 | 0.1 |
| 14 | 2.0 | 45.7 | 0.3 | 0.2 | 0.1 |
| 15 | 2.0 | 52.3 | 0.2 | 0.2 | 0.1 |
| 16 | 2.0 | 58.8 | 0.3 | 0.2 | 0.1 |
| 17 | 2.0 | 63.4 | 0.3 | 0.3 | 0.1 |
| 18 | 2.0 | 69.9 | 0.4 | 0.3 | 0.2 |
| 19 | 2.0 | 75.0 | 0.6 | 0.5 | 0.3 |
| 20 | 2.0 | 78.6 | 1.1 | 0.7 | 0.5 |
| 21 | 2.0 | 81.2 | 1.9 | 1.2 | 0.8 |
| 22 | 2.0 | 85.2 | 3.7 | 3.1 | 2.4 |
| 23 | 4.0 | 31.3 | 0.2 | 0.2 | 0.1 |
| 24 | 4.0 | 38.1 | 0.2 | 0.2 | 0.1 |
| 25 | 4.0 | 45.7 | 0.3 | 0.2 | 0.1 |
| 26 | 4.0 | 52.3 | 0.2 | 0.2 | 0.1 |
| 27 | 4.0 | 58.8 | 0.2 | 0.2 | 0.1 |
| 28 | 4.0 | 63.4 | 0.3 | 0.2 | 0.1 |
| 29 | 4.0 | 69.9 | 0.3 | 0.3 | 0.2 |
| 30 | 4.0 | 75.0 | 0.5 | 0.3 | 0.2 |
| 31 | 4.0 | 78.6 | 0.8 | 0.5 | 0.3 |
| 32 | 4.0 | 81.2 | 1.2 | 0.8 | 0.5 |
| 33 | 4.0 | 85.2 | 1.8 | 1.1 | 0.7 |
| 34 | 6.0 | 31.3 | 0.2 | 0.2 | 0.1 |
| 35 | 6.0 | 38.1 | 0.2 | 0.2 | 0.1 |
| 36 | 6.0 | 45.7 | 0.2 | 0.2 | 0.1 |
| 37 | 6.0 | 52.3 | 0.2 | 0.2 | 0.1 |
| 38 | 6.0 | 58.8 | 0.2 | 0.2 | 0.1 |
| 39 | 6.0 | 63.4 | 0.2 | 0.2 | 0.1 |
| 40 | 6.0 | 69.9 | 0.2 | 0.2 | 0.1 |
| 41 | 6.0 | 75.0 | 0.2 | 0.2 | 0.1 |
| 42 | 6.0 | 78.6 | 0.3 | 0.2 | 0.2 |
| 43 | 6.0 | 81.2 | 0.4 | 0.3 | 0.2 |
| 44 | 6.0 | 85.2 | 0.7 | 0.4 | 0.3 |

Figure 7:
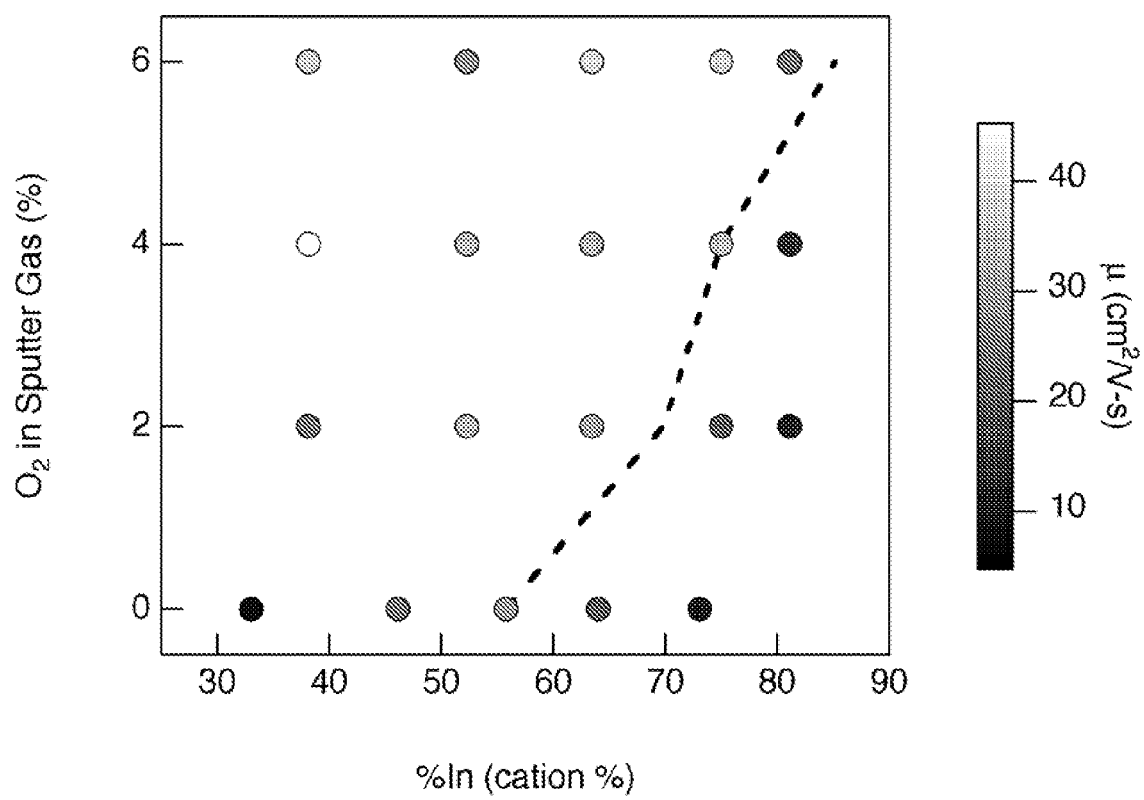
FIG. 7 shows a gray-scale map of the conducting electron mobility as measured using the Hall effect plotted against the same axis as used for FIGS. 2 and 6.
Figure 8:
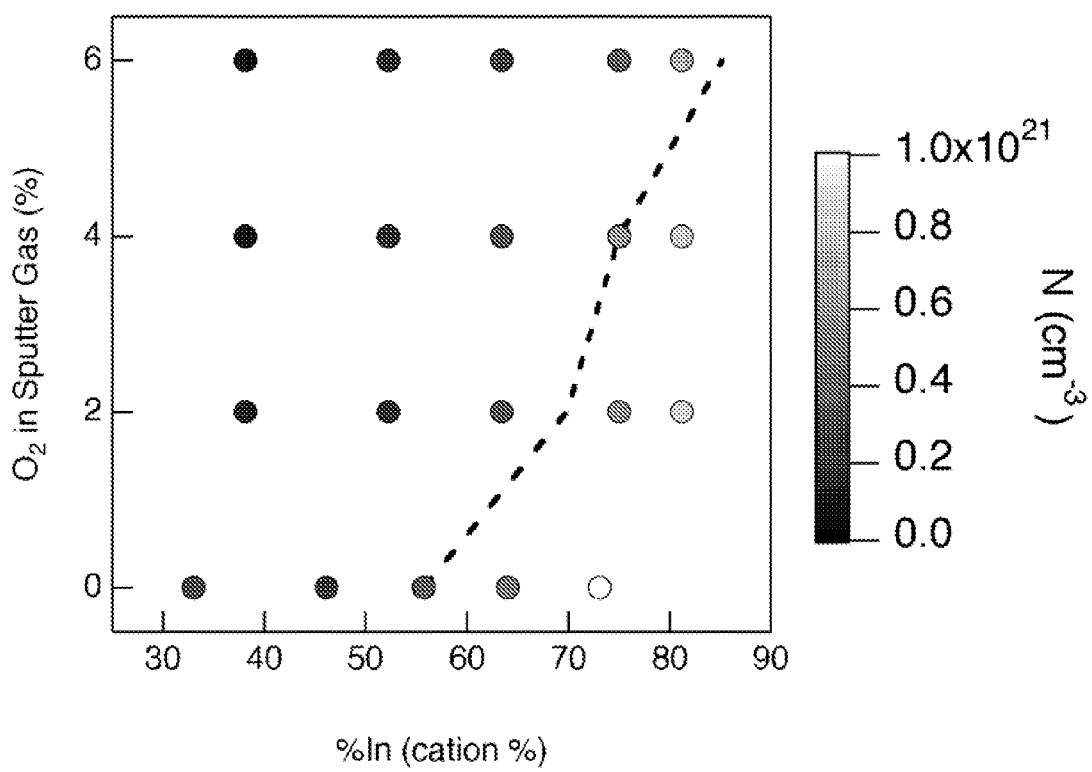
FIG. 8 is a map showing the concentration of conducting electrons as measured by the Hall effect.

FIG. 7 shows a gray-scale map of the conducting election mobility as measured using the Hall effect plotted against the same axis as used for FIGS. 2 and 5. The dashed line shows the ridge of maximum conductivity from FIG. 2. The mobility shows a decrease to the right of the line. FIG. 8 shows a similar map for the conducting electron density measured using the Hall effect. Again the dashed line shows the ridge of maximum conductivity from FIG. 2, FIG. 8 is a map showing the concentration of conducting electrons as measured by the Hall effect. It is noted that there is a substantial increase in the carrier concentration (N) for points to the right of the dashed line.

Table 3 shows data used to generate the plots shown in FIGS. 7 and 8 in tabular form.

TABLE 3

| Point | % O$_2$ in Ar sputter gas | % In (cation %) | Mobililty (cm$^2$/V-s) | Carrier Concentration (cm$^{-3}$) |
|---|---|---|---|---|
| 1 | 0.0 | 26.2 | | |
| 2 | 0.0 | 33.0 | 7.99 | 3.1e+20 |
| 3 | 0.0 | 40.1 | | |
| 4 | 0.0 | 46.1 | 25.1 | 2.5e+20 |
| 5 | 0.0 | 50.7 | | |
| 6 | 0.0 | 55.8 | 29.1 | 3.6e+20 |
| 7 | 0.0 | 60.0 | | |
| 8 | 0.0 | 64.0 | 20.6 | 4.9e+20 |
| 9 | 0.0 | 69.2 | | |
| 10 | 0.0 | 73.1 | 11.8 | 9.9e+20 |
| 11 | 0.0 | 78.3 | | |
| 12 | 2.0 | 31.3 | | |
| 13 | 2.0 | 38.1 | 25.3 | 1.5e+20 |
| 14 | 2.0 | 45.7 | | |
| 15 | 2.0 | 52.3 | 33.5 | 2.3e+20 |
| 16 | 2.0 | 58.8 | | |
| 17 | 2.0 | 63.4 | 31.7 | 3.6e+20 |
| 18 | 2.0 | 69.9 | | |
| 19 | 2.0 | 75.0 | 21.6 | 5.5e+20 |
| 20 | 2.0 | 78.6 | | |
| 21 | 2.0 | 81.2 | 11 | 8.4e+20 |

TABLE 3-continued

| Point | % O$_2$ in Ar sputter gas | % In (cation %) | Mobililty (cm$^2$/V-s) | Carrier Concentration (cm$^{-3}$) |
|---|---|---|---|---|
| 22 | 2.0 | 85.2 | | |
| 23 | 4.0 | 31.3 | | |
| 24 | 4.0 | 38.1 | 52.5 | 8.7e+19 |
| 25 | 4.0 | 45.7 | | |
| 26 | 4.0 | 52.3 | 33.3 | 2.4e+20 |
| 27 | 4.0 | 58.8 | | |
| 28 | 4.0 | 63.4 | 33.3 | 3.5e+20 |
| 29 | 4.0 | 69.9 | | |
| 30 | 4.0 | 75.0 | 33.9 | 5.8e+20 |
| 31 | 4.0 | 78.6 | | |
| 32 | 4.0 | 81.2 | 14 | 7.9e+20 |
| 33 | 4.0 | 85.2 | | |
| 34 | 6.0 | 31.3 | | |
| 35 | 6.0 | 38.1 | 35.9 | 7.1e+19 |
| 36 | 6.0 | 45.7 | | |
| 37 | 6.0 | 52.3 | 28.3 | 1.9e+20 |
| 38 | 6.0 | 58.8 | | |
| 39 | 6.0 | 63.4 | 38.1 | 2.4e+20 |
| 40 | 6.0 | 69.9 | | |
| 41 | 6.0 | 75.0 | 37.2 | 3.7e+20 |
| 42 | 6.0 | 78.6 | | |
| 43 | 6.0 | 81.2 | 24.9 | 7e+20 |
| 44 | 6.0 | 85.2 | | |

The IZO coatings of example 1 have refractive indices less than about 2.1 over the majority of the visible spectrum. The lower refractive index, compared to literature values for these coatings, has several advantages in optical devices. The lower refractive indices for the coatings lead to less reflectance losses in many applications. Preferably the refractive index in most of the visible spectrum of the coatings should be less than about 2.2, more preferably less than about 2.1 and most preferably less than about 2.0.

The absorption in the IZO coatings as described above is dependent on the composition of the coating, the amount of oxygen available from the target, the details the deposition chamber and the amount of oxygen input into the sputtering chamber. The absorption at 500 nm wavelength for a coating approximately 120 nm thick should be less than about 5%, preferably less than about 3.5% and most preferably less than about 2%. Obviously, the amount of absorption would scale as the coating thickness is changed in manner known by one skilled in the art of thin films. The absorption coefficient is a thickness independent measure of a materials intrinsic tendency to absorb light. For a 120 nm thick film, the absorption coefficients ($\alpha$) corresponding to 5%, 3.5% and 2% absorption are $\alpha=0.43\times10^4$ cm$^{-1}$, $0.30\times10^{-4}$ cm$^{-1}$ and $0.17\times10^4$ cm$^{-1}$ respectively. Table 2.1 shows the measured absorption coefficients for the exemplary IZO coatings.

The conductivity of the coating, as taught above, is dependent on the composition of the coating (In and Zn percentages) and the deposition process parameters. For Zn content greater than about 60% the conductivity is greater than about 800 S/cm, more preferably greater than about 1000 S/cm, even more preferably greater than about 1500 S/cm and most preferably greater than about 2000 S/cm. For Zn compositions between about 60 and 40% the conductivity is greater than about 1000 S/cm, more preferably greater than about 1500 S/cm, even more preferably greater than about 2000 S/cm and most preferably greater than about 2500 S/cm. For Zn compositions between about 20 and 40% the conductivity is greater than about 1500 S/cm, more preferably greater than about 2000 S/cm, even more preferably greater than about 2500 S/cm and most preferably greater than about 3000 S/cm.

The coatings are preferably amorphous over the composition range between about 20 and 80% Zn. The coatings may, in certain embodiments, be crystalline. Typically, the crystalline coatings will be obtained at elevated substrate temperatures.

The mobility of the coatings is greater than about 8 cm$^2$/[V-s], more preferably greater than about 20, even more preferably greater than about 30 and most preferably greater than about 40. The electron earner concentration is greater than about 1.5e20/cm$^3$, more preferably greater than about 3.0e20/cm$^3$, even more preferably greater than about 5.0e20/cm$^3$ and most preferably greater than about 7.0e20/cm$^3$.

In general, the results of this example show that different amounts of oxygen may be used by varying the metal content. This effect is expected to continue for in contents lower than the Zn content where the best level of oxygen is zero. For these lower In contents; the use of hydrogen is expected to improve properties of the thin films and continue the coupling effect of metals and oxidation/reduction potential of the gas mixture. Accordingly, various amounts of oxygen may be used to optimize the metal oxide thin film that is produced according to these methods for a wide variety of deposition conditions and process parameters by "tuning" the metals ratio.

It is noted that the Example discussed above is provided for purposes of illustration and is not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

The invention claimed is:

1. A mixed metal oxide thin film, comprising indium and zinc and oxygen, and having a coating with a refractive index less than about 2.1 and a conductivity greater than about 800 S/cm.

2. A thin film of claim 1 further comprising a conductivity greater than 1000 S/cm.

3. A thin film of claim 1 wherein the further comprising a conductivity greater than 1500 S/cm.

4. A thin film of claim 1 further comprising a conductivity greater than about 2000 S/cm.

5. A thin film of claim 1 further comprising a conductivity greater than about 2500 S/cm.

6. A thin film of claim 1 further comprising an amorphous coating.

7. A thin film of claim 1 further comprising a crystalline coating.

8. A thin film of claim 1 further comprising a Zn percentage between 20 and 80%.

9. A thin film of claim 1 further comprising a Zn percentage between 40 and 60%.

10. A thin film of claim 1 wherein absorption for about an 120 nm thickness coating is less than about 5% at 500 nm wavelength of light.

11. A thin film of claim 1 wherein absorption for about an 120 nm thickness coating is less than about 3% at 500 nm wavelength of light.

12. A thin film of claim 1 wherein absorption for about an 120 nm thickness coating is less than about 2% at 500 nm wavelength of light.

13. A thin film of claim 1 further comprising a mobility greater than about 8 cm$^2$/V-s.

14. A thin film of claim 1 further comprising a mobility greater than about 20.

15. A thin film of claim 1 further comprising a mobility greater than about 30.

16. A thin film of claim 1 further comprising a mobility greater than about 40.

17. A thin film of claim 1 further comprising an electron carrier concentration greater than about 1.5e20 electrons/cm$^3$.

18. A thin film of claim 1 further comprising an electron carrier concentration greater than 3e20.

19. A thin film of claim 1 further comprising an electron carrier concentration greater than 5e20.

20. A thin film of claim 1 further comprising an electron carrier concentration greater than 7e20.

21. A mixed metal oxide thin film, comprising indium and zinc and oxygen, having a conductivity greater than about 800 S/cm, and an absorption coefficient $\alpha$ is less than about $1.0 \times 10^4$ cm$^{-1}$.

22. A thin film of claim 21 wherein the absorption coefficient $\alpha$ is less than about $0.5 \times 10^4$ cm$^{-1}$.

23. A thin film of claim 21 wherein the absorption coefficient $\alpha$ is less than about $0.3 \times 10^4$ cm$^{-1}$.

24. A thin film of claim 21 wherein the absorption coefficient $\alpha$ is less than about $0.2 \times 10^4$ cm$^{-1}$.

25. A thin film of claim 21 further comprising the conductivity selected from at least one of the following: >1000 S/cm, >1500 S/cm, >2000 S/cm, and >2500 S/cm.

26. A thin film of claim 21 further comprising a mobility selected from at least one of the following: >8, >20, >30, and >40.

27. A thin film of claim 21 further comprising a refractive index less than about 2.1.

28. A thin film of claim 21 further comprising an electron carrier concentration from at least one of the following: >1.5E20, >3.0E20, >5.0E20 and >7E20.

* * * * *